United States Patent
Barillaro et al.

(10) Patent No.: US 10,221,066 B2
(45) Date of Patent: Mar. 5, 2019

(54) PROCESS FOR MANUFACTURING A MICROELECTROMECHANICAL INTERACTION SYSTEM FOR A STORAGE MEDIUM

(71) Applicant: STMICROELECTRONICS S.R.L., Agrate Brianza (IT)

(72) Inventors: Giuseppe Barillaro, Pisa (IT); Alessandro Diligenti, Leghorn (IT); Caterina Riva, Cusago (IT); Roberto Campedelli, Novate Milanese (IT); Stefano Losa, Cornaredo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 393 days.

(21) Appl. No.: 15/220,267

(22) Filed: Jul. 26, 2016

(65) Prior Publication Data
US 2016/0332871 A1    Nov. 17, 2016

Related U.S. Application Data

(62) Division of application No. 11/958,945, filed on Dec. 18, 2007.

(30) Foreign Application Priority Data

Dec. 20, 2006  (IT) ............................. TO2006A0907

(51) Int. Cl.
*B81C 1/00*    (2006.01)
*H01L 27/10*   (2006.01)

(52) U.S. Cl.
CPC ...... *B81C 1/00539* (2013.01); *B81C 1/00595* (2013.01); *H01L 27/10* (2013.01); *B81B 2201/038* (2013.01); *B81B 2201/07* (2013.01); *B81B 2201/12* (2013.01); *B81B 2203/019* (2013.01); *B81B 2203/0118* (2013.01); *B81C 2201/0136* (2013.01); *B81C 2203/0714* (2013.01)

(58) Field of Classification Search
CPC ....................................................... B81C 1/00
See application file for complete search history.

(56) References Cited

U.S. PATENT DOCUMENTS

| | | |
|---|---|---|
| 6,046,066 A | 4/2000 | Fang et al. |
| 6,328,902 B1 | 12/2001 | Hantschel et al. |
| 6,477,132 B1 | 11/2002 | Azuma et al. |
| 6,504,152 B2 | 1/2003 | Hantschel et al. |
| 6,886,395 B2 | 5/2005 | Minne |

(Continued)

*Primary Examiner* — Marvin Payen
(74) *Attorney, Agent, or Firm* — Seed IP Law Group LLP

(57) ABSTRACT

A process for manufacturing an interaction system of a microelectromechanical type for a storage medium, the interaction system provided with a supporting element and an interaction element carried by the supporting element, envisages the steps of: providing a wafer of semiconductor material having a substrate with a first type of conductivity and a top surface; forming a first interaction region having a second type of conductivity, opposite to the first type of conductivity, in a surface portion of the substrate in the proximity of the top surface; and carrying out an electrochemical etch of the substrate starting from the top surface, the etching being selective with respect to the second type of conductivity, so as to remove the surface portion of the substrate and separate the first interaction region from the substrate, thus forming the supporting element.

24 Claims, 5 Drawing Sheets

(56) References Cited

U.S. PATENT DOCUMENTS

| | | |
|---|---|---|
| 7,315,505 B2 | 1/2008 | Adelmann |
| 2004/0237650 A1 | 12/2004 | Yang |
| 2005/0013230 A1 | 1/2005 | Adelmann |
| 2005/0112621 A1 | 5/2005 | Kim et al. |
| 2005/0206483 A1 | 9/2005 | Pashby et al. |
| 2008/0316906 A1 | 12/2008 | Bollati et al. |
| 2009/0095705 A1 | 4/2009 | Riva et al. |

PROCESS FOR MANUFACTURING A MICROELECTROMECHANICAL INTERACTION SYSTEM FOR A STORAGE MEDIUM

BACKGROUND

1. Technical Field

The present invention relates to a process for manufacturing a microelectromechanical interaction system for a storage medium, in particular for so-called "probe storage" applications, to which the following treatment will make explicit reference, without this implying any loss of generality.

2. Description of the Related Art

As is known, in the last few years alternative storage systems have been proposed to overcome the limitations of traditional storage systems based on magnetism, such as, for example, hard disks. Amongst these systems, of particular importance are the so-called "probe storage" (also referred to as "atomic-level storage" or "atomic storage") systems, which enable high data-storage capacities to be obtained in small dimensions, with low manufacturing costs.

In brief (FIG. 1), a probe-storage device 1 comprises a two-dimensional array of interaction systems (or probes) 2, fixed to a common substrate 3, for example made of silicon, in which a control electronics is provided, for example using CMOS technology. The array is arranged above a storage medium 4, typically not patterned, and is mobile relative to the storage medium, generally in a first direction x and in a second direction y, which are mutually orthogonal, by the action of a micromotor associated therewith. Each interaction system 2 comprises: a supporting element 5 made of semiconductor material, in particular silicon (generally known as "cantilever" or "cantilever beam"), suspended in cantilever fashion above the storage medium 4, and moveable in a third direction z, orthogonal to the first and second directions x, y so as to approach the storage medium 4; and an interaction element 6 (also defined as "sensor" or "contact element"), carried by the supporting element 5 at a free end thereof, and facing the storage medium 4. In particular, by the term "interaction" is meant any operation of reading, writing or erasure of a single bit (or a number of bits) of information, which implies an exchange of signals between the interaction system 2 and the storage medium 4. Via the respective interaction element 6, having nanometric dimensions, each interaction system 2 is able to interact locally at an atomic level with a portion of the storage medium 4, for writing, reading, or erasing bits of information.

The physical characteristics (hardness, roughness, etc.), morphological characteristics (dimensions, shape, etc.) and electrical characteristics (resistivity, conductivity, etc.) of the interaction element 6 are strictly correlated to the material of the storage medium 4 with which it is associated (polymeric, ferroelectric, phase-change, etc.), and to the interaction mechanisms for reading/writing/erasing data (thermal, piezoresistive, charge-transfer, etc.).

For example, storage systems of the probe-storage type have been designed, in which the interaction mechanisms involve thermal and/or piezoresistive processes. In these systems, the interaction element 6 has a sharpened shape, enabling the formation of "bits" with nanometric dimensions so as to increase storage density. In a known way, during operations of writing of data, the interaction element 6 is heated via appropriate heating elements (for example, of a resistive type) integrated in the interaction system 2, and is pushed into contact with the storage medium 4, for formation of single bits (the presence or absence of a bit encoding in a binary way the data to be stored). Reading operations are based on resistance variations occurring in the interaction system 2 as a function of temperature, or as a result of the piezoresistive effect due to mechanical deformations, when the interaction system is moved above the storage medium.

The processes for manufacturing probe-storage devices envisage in a known way formation of the array of interaction systems 2 starting from an SOI (Silicon-On-Insulator) wafer, via micromachining techniques that envisage release of the various supporting elements 5 from an epitaxial layer of the SOI wafer, via appropriate chemical etching of an underlying oxide layer and if necessary of a bulk layer of the wafer. The interaction elements 6 are typically made prior to the step of release of the corresponding supporting elements 5. The array of interaction systems 2 is then coupled to a CMOS wafer (substrate 3) integrating the associated interface/control electronics by means of "chip-to-wafer" or "wafer-to-wafer" bonding techniques.

Known manufacturing processes have a number of problems, amongst which: high costs, mainly due to the use of composite SOI wafers; the need to resort to wafer-to-wafer bonding techniques to couple the interaction systems to the corresponding interface/control electronics; and the incompatibility with the so-called "CMOS back-end" (i.e. the formation of the MEMS structures after carrying out of the CMOS processes, in a same wafer of semiconductor material) due to thermal budget issues of the associated micromachining steps, and to recipe uniformity issues of silicon chemical etching. Furthermore, the steps of formation of the interaction elements 6 and release of the supporting elements 5 pose a series of problems of process integration, in particular for ensuring an adequate protection of the interaction elements 6 already formed, in process steps subsequent to their formation.

Up to now, fully satisfactory processes for manufacturing interaction systems for probe-storage devices have not been proposed.

BRIEF SUMMARY

One embodiment of the present invention is a manufacturing process that enables the aforesaid problems and disadvantages to be overcome.

According to the present invention, a process for manufacturing a microelectromechanical interaction system for a storage medium is consequently provided as defined in claim 1.

BRIEF DESCRIPTION OF THE SEVERAL VIEWS OF THE DRAWINGS

For a better understanding of the present invention, there now follows a description of some preferred embodiments thereof, provided purely by way of non-limiting example and with reference to the attached drawings, wherein:

FIGS. 2a-9a are top plan views of a wafer of semiconductor material in successive steps of a process for manufacturing a microelectromechanical interaction system according to one embodiment of the present invention;

FIGS. 2b-9b are cross-sectional views of the wafer of semiconductor material taken along the lines II-II—IX-IX of FIGS. 2a-9a.

DETAILED DESCRIPTION

Figure 1:
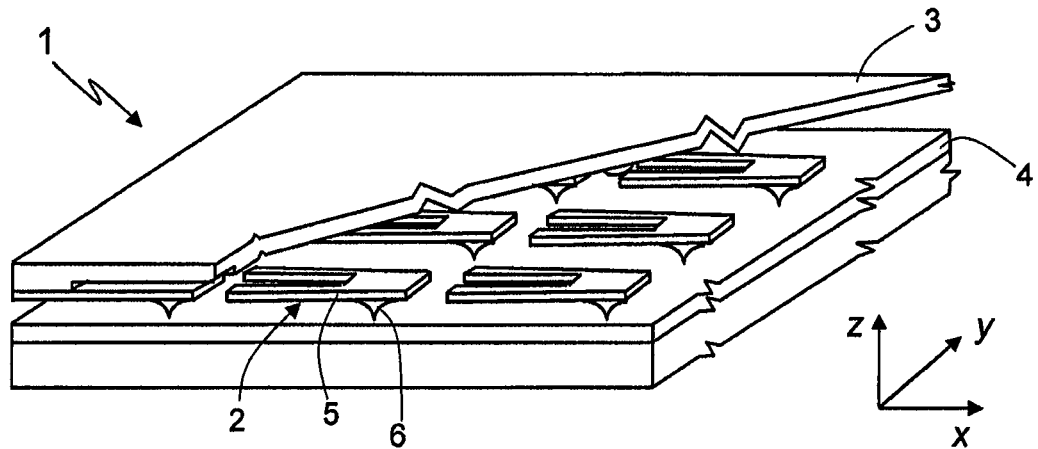
FIG. 1 is a schematic perspective representation, partially in cutaway view, of a probe-storage device.
Figure 2A:
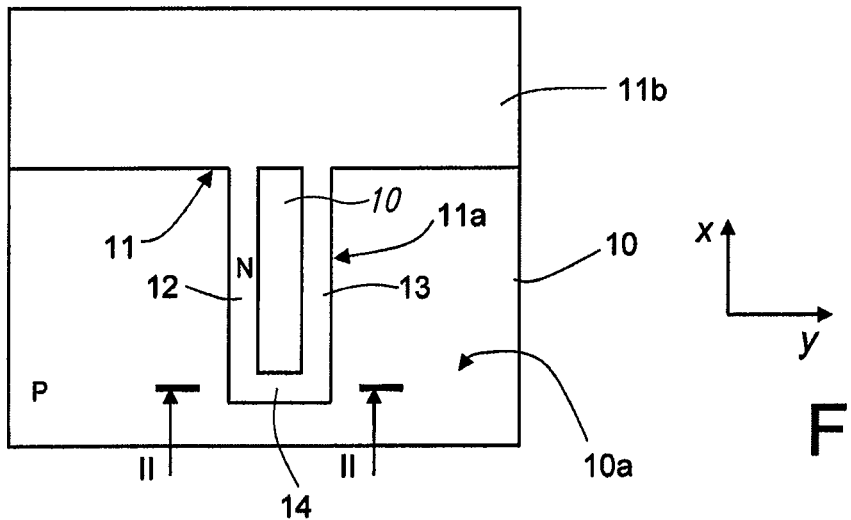
Figure 2B:
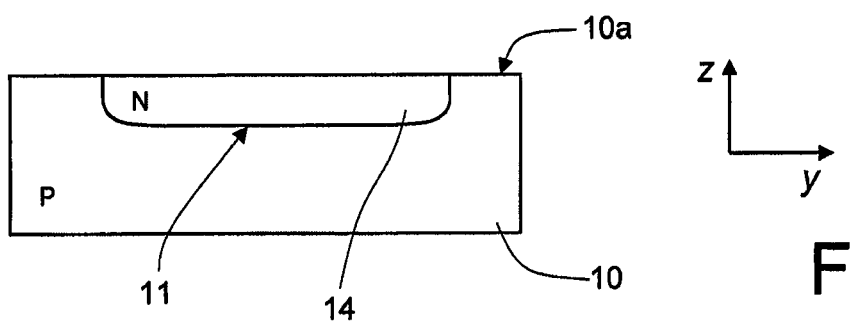

In detail, the process for manufacturing an interaction system 2 for a storage medium 4 according to one embodiment envisages first (FIGS. 2*a*-2*b*) the provision of a wafer of semiconductor material, in particular monocrystalline silicon, comprising a monolithic substrate of a standard (non-composite) type, designated by 10, having a conductivity of a P type, and a top surface 10*a*. The process proceeds with the execution of an implant with N-type conductivity through an appropriate resist mask (not illustrated), for formation, within a surface portion of the substrate 10 at the top surface 10*a*, of a doped region 11 having N-type conductivity. In particular, the doped region 11 comprises a first interaction region 11*a*, the shape of which, after appropriate diffusion of the implant, corresponds to a desired shape for the supporting element 5 of the interaction system 2, and a body region 11*b*, from which the first interaction region 11*a* extends. For example, the first interaction region 11*a* comprises a first arm 12 and a second arm 13, extending in a first direction x and separated by the substrate 10 in a second direction y transverse to the first direction x, and a connection portion 14, connecting together the ends of the first and second arms not connected to the body region 11*b* (and extending transverse to an extension direction of the arms, in the second direction y). As will be clarified in what follows, the depth of the implant and the following diffusion determine a thickness of the supporting element 5, which is, for example, of the order of micron.

Figure 3A:
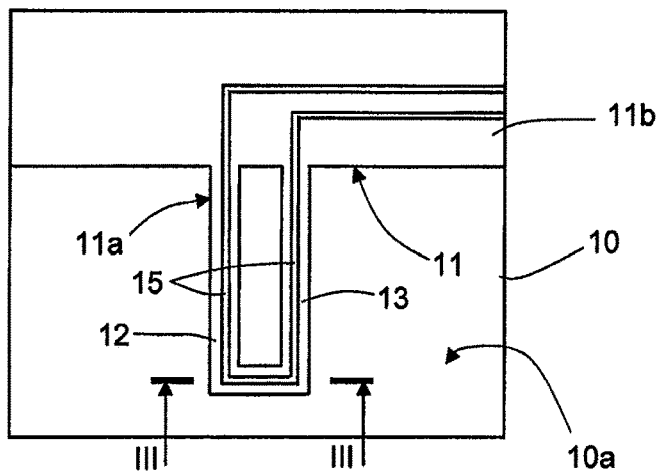
Figure 3B:
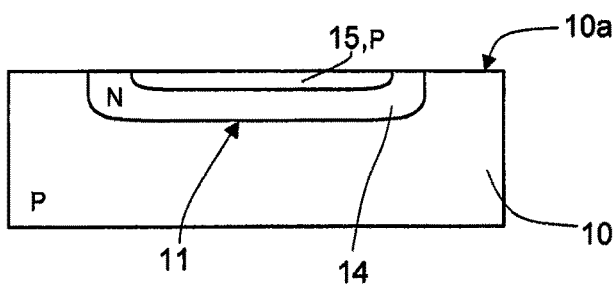

Next (FIGS. 3*a*-3*b*) an implant with a P-type conductivity is carried out through a further mask of appropriate shape and dimension (not illustrated), for formation, within a surface portion of the doped region 11, of a resistor region 15, having a P-type doping and designed to form a heating resistor buried within the supporting element 5. In particular, the resistor region 15 extends within the first interaction region 11*a*, having the shape thereof (hence having respective first and second arms 15*a*, 15*b* and a respective connection portion 15*c*), and has within the body region 11*b* two electrical connection portions 15*d*, 15*e* connected to the respective first and second arms 15*a*, 15*b*.

Figure 4A:
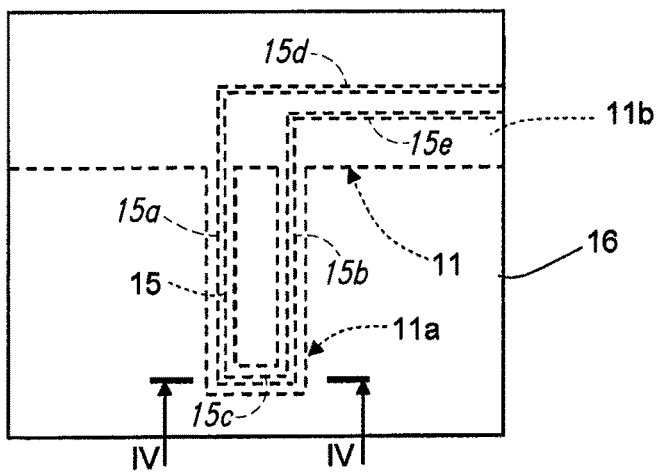
Figure 4B:
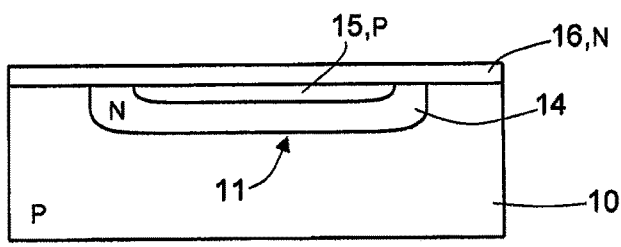

A first epitaxial growth of an N type is then carried out (FIGS. 4*a*-4*b*), which involves the entire top surface 10*a* of the substrate 10, for formation of a first epitaxial layer 16 on the substrate 10. In particular, the first epitaxial layer 16 closes the resistor region 15 at the top, in this way forming a buried resistor.

Figure 5A:
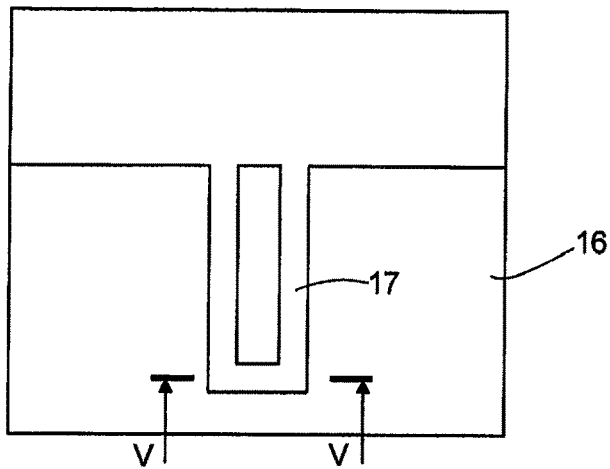
Figure 5B:
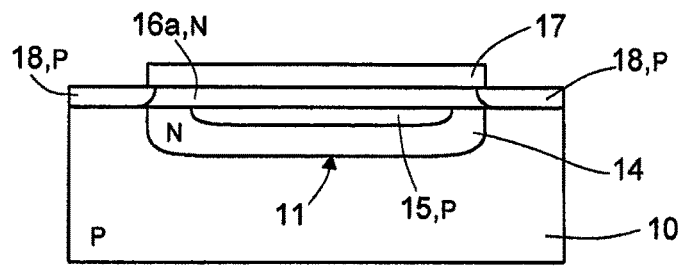

A first implant mask 17 is then formed (FIGS. 5*a*-5*b*) on the first epitaxial layer 16, arranged above the entire doped region 11. Through the first implant mask 17 a P-type implant is carried out within the uncovered portion of the first epitaxial layer 16; the implant is calibrated so as to involve the entire thickness in order to reverse the conductivity thereof and thus form a sacrificial region 18, with a P-type doping, which joins to the substrate 10. The doped sacrificial region 18 defines and delimits a cover region 16*a*, constituted by the remaining portion of the first epitaxial layer 16 and set on the doped region 11.

Figure 6A:
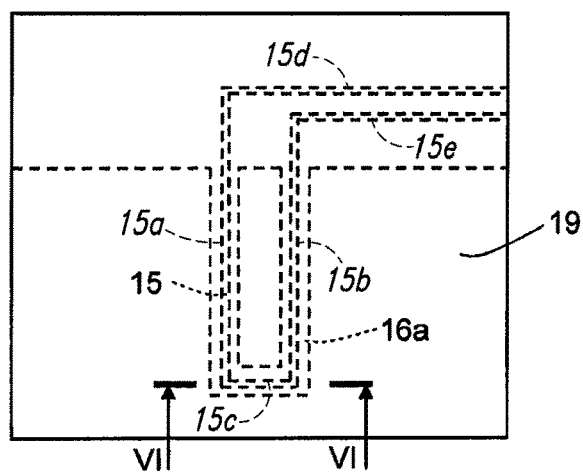
Figure 6B:
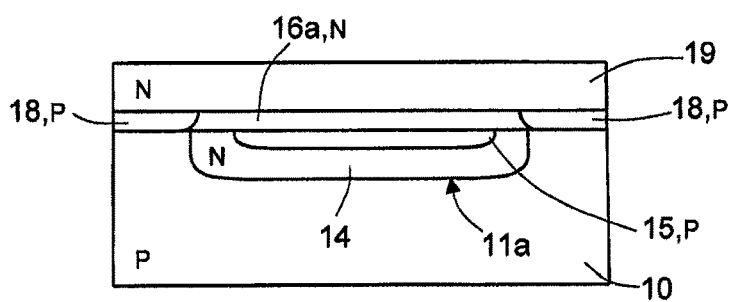

Next (FIGS. 6*a*-6*b*), a new epitaxial growth of an N type is carried out, which involves the entire surface of the wafer, for formation of a second epitaxial layer 19 on the cover region 16*a* and the sacrificial region 18. As will be clarified in what follows, the thickness of the second epitaxial layer 19 determines a thickness (or height) of the interaction element 6 of the interaction system 2; for example, this thickness is comprised between 300 and 700 nm.

Figure 7A:
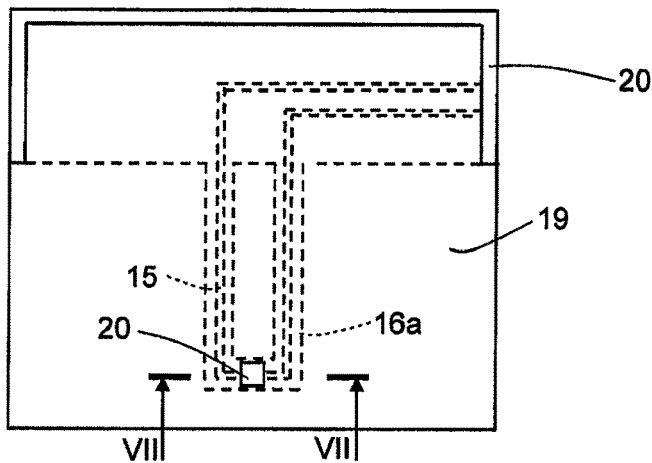
Figure 7B:
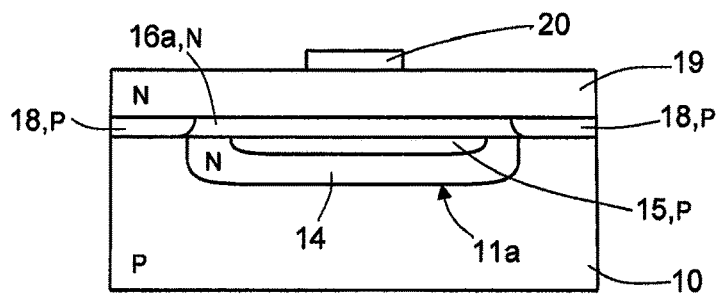

Next (FIGS. 7*a*-7*b*), a second implant mask 20 is formed above the second epitaxial layer 19, set in particular above a central area of the connection portion 14 of the first interaction region 11*a*, and above peripheral portions (i.e., portions arranged at sides not in contact with the first interaction region 11*a*) of the body region 11*b*. The second implant mask 20 has non-submicrometric smaller dimensions, for example in the region of 1-2 μm, and a lay-out with a geometry that can vary in relation to a desired final shape of the interaction element 6. Typically, for an interaction element with a sharpened conical shape, the second implant mask has a circular lay-out above the connection portion 14.

Figure 8A:
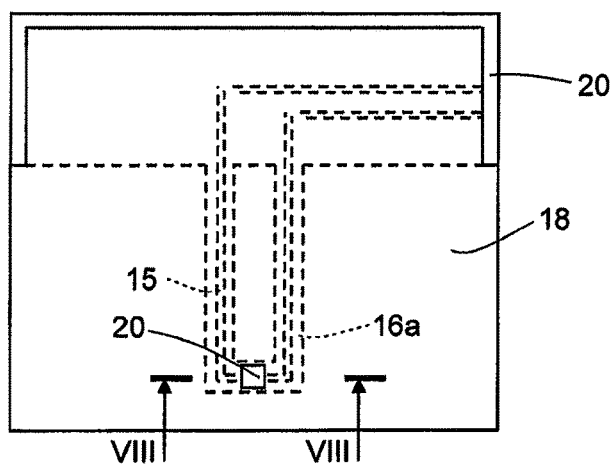
Figure 8B:
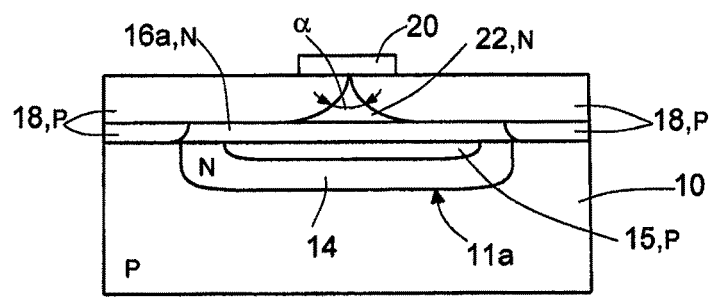

Through the second implant mask 20 (FIGS. 8*a*-8*b*), a P-type implantation is then carried out within the second epitaxial layer 19 (calibrated so that the depth of implantation after diffusion equals the thickness of the same epitaxial layer), followed by an appropriate lateral diffusion of the introduced dopants. The implantation leads to the reversal of the conductivity of the uncovered portion of the second epitaxial layer 19, throughout its thickness, forming a P-type doped region that joins up to the sacrificial region 18 (from which henceforth it will no longer be distinguished) and to the substrate 10. The sacrificial region 18, due to the process of lateral diffusion, extends in part underneath the second implant mask 20 (the extension of the fronts of lateral diffusion underneath the mask, decreasing, in a known way, as the level of penetration increases within the second epitaxial layer 19). In this way, above the aforesaid central area of the connection portion 14, a second interaction region 22 is defined, designed to form the interaction element 6 and having a sharpened shape. Clearly, the shape and the resulting size of the second interaction region 22 are dependent on the shape of the second implant mask 20 and on the implant parameters (in terms of energy and dose), and on the aforesaid lateral diffusion. In any case, the diffusion enables a sharpened structure to be obtained with sub-lithographic dimensions (where by "sub-lithographic dimension" is meant herein a dimension smaller than a minimum dimension obtainable with a lithographic technique; for example, a sub-lithographic dimension is smaller than 50 nm, in particular smaller than or equal to 20 nm). For example, the aforesaid fronts of lateral diffusion can meet underneath the second implant mask 20, and the second interaction region 22 can consequently have a conical shape with hollowed side walls, having a base with extension that is a function of the dimensions of the second implant mask 20, and a tip end having sub-lithographic dimension. The internal angle defined by the tip end, designated by α, is for example comprised between 30° and 70°.

Figure 9A:
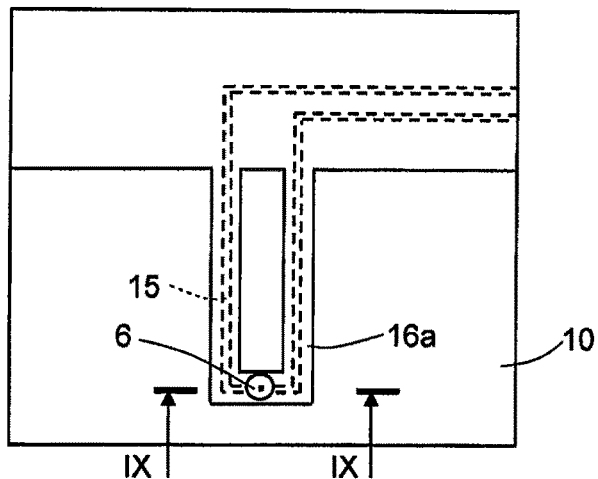
Figure 9B:
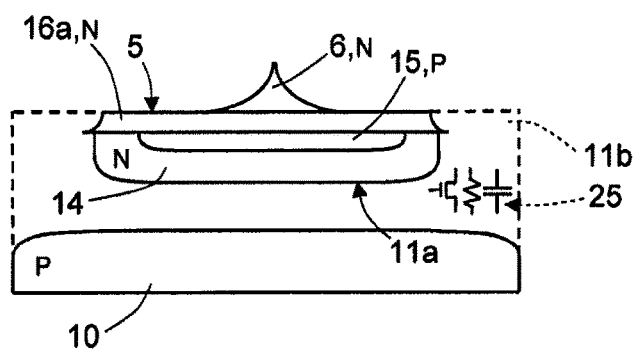

Next (FIGS. 9*a*-9*b*), according to one embodiment, an electrochemical wet etching is carried out in the dark (i.e., without lighting sources) of the P-type semiconductor material of the wafer, in a highly selective way with respect to the N-type semiconductor material. In detail, the electrochemical etch involves the sacrificial region 18 and an underlying surface portion of the substrate 10 (which is contiguous to the sacrificial region), and is calibrated so as to involve a thickness of material greater than the sum of the thicknesses of the first and second epitaxial layers 16, 19 (equal to the thickness of the sacrificial region 18) and of the doped region 11, so as to involve also a portion of the substrate 10 underlying the first interaction region 11*a* of the doped region. Accordingly, definition of the interaction element 6 (constituted by the second interaction region 22 freed from the sacrificial doped region 18), and release from the substrate 10 of the supporting element 5 of the interaction system 2 are simultaneously obtained; the supporting element 5 is thus suspended in cantilever fashion above the substrate 10 (in other words, it is separated at the bottom from the substrate) and is consequently actuatable in a third direction z, transverse to the plane xy. The interaction system 2 is at this point defined, and comprises the supporting element 5 (constituted by the first interaction region 11*a*, integrating the resistor region 15, and by the cover region 16*a*) and the interaction element 6 (constituted by the second interaction region 22). Evidently, the same electrochemical etch does not cause, instead, separation from the substrate 10 of the body region 11*b* of the doped region 11, given the larger dimensions of the body region in the plane xy.

In greater detail, the electrochemical etch is performed with a solution comprising: an appropriate percentage of hydrofluoric acid HF, ranging between 1 vol % and 25 vol %, preferably between 1 vol % and 5 vol %, even more preferably equal to 2.5 vol %; possible additives (surfactants, alcohol, etc.) in order to improve etching uniformity; and water ($H_2O$), in the remaining part, for example in a percentage of 95 vol %.

Furthermore, etching is carried out under anodization conditions (so as to cause dissolution, activated by holes, of the P-type silicon), and with a current density $J > J_{ps}$ and with a voltage $V > V_{ps}$ (where $J_{ps}$ and $V_{ps}$ are, in a known way, values corresponding to an electropolishing condition). For this purpose, an anodization voltage is applied between the front and the back of the wafer through a conductive path of a P type defined by the substrate 10 and by the sacrificial region 18. The etching rate depends on the concentration of HF in solution and, once this is fixed, on the doping concentration of the P-type semiconductor material.

Afterwards, in a per-se known manner, the wafer of semiconductor material in which the interaction systems 2 have been formed, arranged as an array (it is evident that the process described enables simultaneous definition of a plurality of interaction systems 2 aligned in rows and columns), is coupled to a storage medium 4 (not illustrated herein) so as to be suspended above the same storage medium.

The advantages of the manufacturing process emerge clearly from the foregoing description.

In any case, it is emphasized that the use of monolithic standard substrates of semiconductor material, and not of SOI composite substrates, enables a reduction of the manufacturing costs. In particular, the electrochemical etch enables release of the supporting element 5 from the substrate 10, removing a sacrificial surface portion of the same substrate.

It is possible to obtain a good control of the uniformity of the thickness of the supporting element 5, given that it is defined by means of steps of epitaxial growth and implantation and diffusion of an N-doped region, and not via a chemical etching step, and of the uniformity of the thickness (or height) and of the sharpened shape of the interaction element 6, given that it is defined by means of steps of implantation and lateral diffusion, and once again not via a chemical etching step. In particular, for the purposes of the application described, it is extremely advantageous to obtain a good repeatability of the critical dimensions of the interaction element 6, without resorting to techniques of submicrometric lithography.

Given that the supporting element 5 and the interaction element 6 are defined simultaneously in a single final (non-lithographic) step of the manufacturing process, problems of process integration do not arise, which are indeed associated with the need of protecting the tip during process steps subsequent to its formation, and in particular during the step of release of the supporting element 5.

The described process is also fully compatible with the back-end CMOS technology, and an appropriate CMOS electronics can be provided within the same substrate 10, from which the microelectromechanical structures are obtained. For example, as illustrated schematically in FIG. 9*b*, a CMOS electronics 25 for the interaction system 2 can be provided in a peripheral surface region of the body region 11*b*, in a step prior to the manufacturing of the microelectromechanical interaction system (the release of the supporting element and the definition of the interaction element being the final step of the manufacturing process). Masking, implantation and diffusion steps, common to the CMOS manufacturing process, can be used. In this way, it is also possible to avoid the costly steps of wafer-to-wafer bonding characterizing the known art.

The portions of the second implant mask 20 set on the peripheral portions of the body region 11*b*, in addition to separating adjacent interaction systems 2 from one another, protect underlying regions that must not be etched and/or damaged during subsequent electrochemical etching, in particular CMOS electronic circuits that might present in the same substrate.

Finally, it is clear that modifications and variations can be made to what is described and illustrated herein, without thereby departing from the scope of the present invention, as defined in the annexed claims.

The steps involving formation of the buried heating resistor can be omitted, in the case where interaction with the storage medium 4 does not require local heating (for example because it is based entirely on piezoresistive processes). In particular, the steps of formation of the resistor region 15 (FIGS. 3*a*-3*b*), formation of the first epitaxial layer 16 (FIGS. 4*a*-4*b*), and implantation of a P type through the first implant mask 17 (FIGS. 5*a*-5*b*) could be omitted; the subsequent implantation of a P type through the second implant mask 20 (FIGS. 8*a*-8*b*), and the corresponding lateral diffusion, are in this case in themselves able both to define the tip and to create a path of a P type towards the substrate 10 for the subsequent electrochemical etching.

Furthermore, the electrochemical etch might be calibrated in such a way as to remove the substrate 10 underneath the interaction region 11*a*, throughout its thickness.

Figure 10:
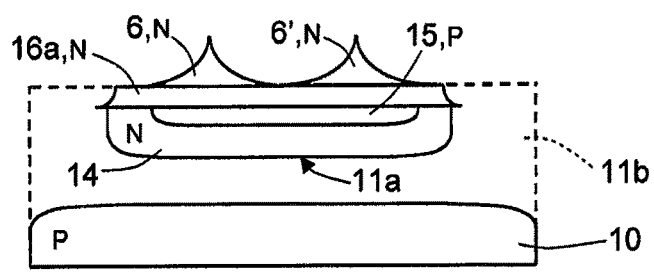
FIGS. 10-11 are cross-sectional views similar to that of FIG. 9*b*, regarding variants of the microelectromechanical interaction system.

According to a variant of the present invention, the process steps are exploited for formation of a further interaction element 6', simultaneously with formation of the interaction element 6 described previously. For example, the presence of two interaction elements 6, 6' can be advantageous, in a per-se known manner that is not described in detail, to carry out combined operations of reading and rewriting of the data previously erased during the reading step, in the case where the storage medium 4 comprises ferroelectric material. It will in this case be sufficient to modify the second implant mask 20 to obtain the interaction system illustrated in FIG. 10, where two interaction elements 6, 6' are aligned in the second direction y, transverse to the direction of extension of the first and second arms 12, 13. In a similar way, the process described is suited to formation of a number of interaction elements greater than two by appropriately modifying the aforesaid implant mask; the interaction elements thus obtained can also not be aligned with one another, and set according to a desired configuration.

Figure 11:
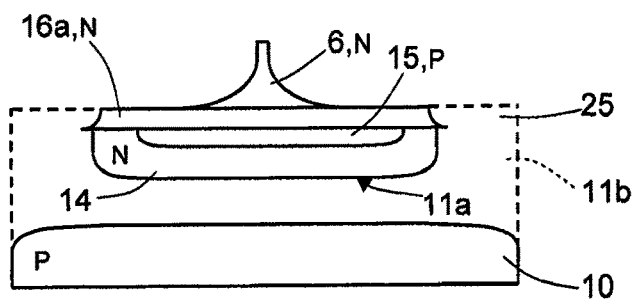

Furthermore, the interaction element 6 could have a shape different from the one illustrated, for example, it could have a rectangular, elliptical or generically polygonal base. As illustrated in FIG. 11, in the case where the fronts of lateral diffusion of the implantation do not meet underneath the second implant mask 20 (due to a modification of the dimensions of the second implant mask 20, or to a modification of the implantation parameters), the interaction element 6 has an upper end with a flat surface (with a width depending on the aforesaid dimensions and the aforesaid parameters).

In addition, the process described can be adapted to enable formation of interaction elements 6 made of non-semiconductor material, for example metal. In this case, the interaction element 6 can be obtained prior to release via electrochemical etching of the supporting element 5 from the substrate 10.

The interaction system 2 can be associated to storage media of a wide range of materials, for example ferroelectric, polymeric or phase-change materials, and used in any application in which a sub-lithographic smaller dimension for interaction with a storage medium is desired.

Finally, the process described, envisaging release of regions with N-type doping from a P-type substrate via selective electrochemical etching, could be used for formation of further MEMS structures, for example buried cavities for pressure sensors, or buried channels for "Lab-on-Chip" applications.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
manufacturing a microelectromechanical interaction system for a storage medium, said interaction system including a supporting element and an interaction element carried by said supporting element, the manufacturing including:
forming, in a semiconductor wafer having a substrate with a first type of conductivity and a top surface, a first interaction region having a second type of conductivity, opposite to said first type of conductivity, in a surface portion of said substrate in proximity of said top surface; and
electrochemically etching said substrate starting from said top surface, selective with respect to said second type of conductivity, the electrochemically etching including removing said surface portion of said substrate and separating said first interaction region from said substrate, thus forming said supporting element.

2. The process according to claim 1, wherein said first conductivity is of a P type and said second conductivity is of an N type; said electrochemically etching being carried out in a dark condition with an aqueous solution of HF.

3. The process according to claim 2, wherein said solution comprises a percentage of hydrofluoric acid HF comprised between 1 vol % and 25 vol %.

4. The process according to claim 1, wherein after said electrochemically etching, said supporting element is suspended in cantilever fashion above said substrate, and said interaction element has a sharpened shape facing in a direction opposite to said substrate.

5. The process according to claim 1, comprising, prior to the electrochemically etching, forming a path with said first type of conductivity between said top surface and an opposite bottom surface of said semiconductor wafer.

6. The process according to claim 1, wherein said first interaction region comprises first and second arms extending in a first direction, and a connection portion extending in a second direction, transverse to said first direction, and joining said first and second arms at first ends of the first and second arms; said first and second arms being separated in said second direction by said substrate.

7. The process according to claim 6, further comprising, simultaneously to forming the first interaction region, forming, in a further surface portion of said substrate, a body region, having said second type of conductivity and joined to said first interaction region, said first and second arms extending from said body region in said first direction, and joined at second ends of the first and second arms to said body region.

8. The process according to claim 1, wherein forming the first interaction region comprises introducing dopant species of said second type of conductivity within said substrate, and defining a thickness of said supporting element by controlling a depth of introduction of said dopant species.

9. The process according to claim 1, further comprising forming, above said top surface and above a specific portion of said first interaction region, a second interaction region having said second type of conductivity, said second interaction region being surrounded by a sacrificial region, having said first type of conductivity and having a bottom joined to said substrate; wherein said electrochemically etching further comprises defining said interaction element on top of said supporting element by removing said sacrificial region, in a way substantially simultaneous to separating said first interaction region from said substrate.

10. The process according to claim 9, wherein forming the second interaction region comprises:
forming an epitaxial structural layer on said top surface;
forming a mask region on said structural layer, above said specific portion of said first interaction region; and
introducing dopant species of said first type of conductivity within said structural layer through said mask region for reversing a conductivity of said structural layer, thus defining said second interaction region underneath said mask region and creating a path having said first type of conductivity towards said substrate.

11. The process according to claim 10, wherein said first interaction region comprises first and second arms extending in a first direction, and a connection portion extending in a second direction, transverse to said first direction, and joining said first and second arms at first ends of the first and second arms; said first and second arms being separated in said second direction by said substrate, wherein said specific portion of said first interaction region is set centrally above said connection portion.

12. The process according to claim 10 wherein introducing dopant species of said first type of conductivity comprises implanting, and subsequently diffusing underneath said mask region, said dopant species; and defining a desired dimension and shape of said interaction element by controlling parameters of said implanting and of said diffusing, and/or dimensions of said mask region.

13. The process according to claim 12 wherein said defining is such that said interaction element has nanometric or smaller dimensions, and a sharpened shape with a tip end facing away from said top surface of said substrate.

14. The process according to claim 12 wherein said defining is such that fronts of said diffusing meet underneath said mask region, so that said interaction element has a conical shape with hollowed walls.

15. The process according to claim 9, further comprising:
    forming a resistor region, having said first type of conductivity, within said first interaction region; and
    prior to said forming the second interaction region, forming a cover region, having said second type of conductivity, on said first interaction region, the covering region burying the resistor region within said first interaction region.

16. The process according to claim 15 wherein said forming the cover region comprises:
    forming an epitaxial cover layer on top of said substrate; and reversing a conductivity of said cover layer except at the top of said first interaction region, thus forming said cover region on said first interaction region, and a sacrificial region elsewhere, designed to create a path having said first type of conductivity towards said substrate.

17. The process according to claim 1 wherein said substrate is monolithic, and said semiconductor material is monocrystalline silicon.

18. A process for manufacturing a probe-storage device, comprising:
    forming a storage medium;
    forming an interaction system with a supporting element and an interaction element carried by said supporting element, forming the interaction system including:
        forming, in a semiconductor wafer having a substrate with a first type of conductivity and a top surface, a first interaction region having a second type of conductivity, opposite to said first type of conductivity, in a surface portion of said substrate in proximity of said top surface; and
        electrochemically etching said substrate starting from said top surface, selective with respect to said second type of conductivity, the electrochemically etching removing said surface portion of said substrate and separating said first interaction region from said substrate, thus forming said supporting element; and
    coupling said interaction system to the storage medium in such a way that said supporting element is suspended in cantilever fashion above said storage medium and said interaction element faces said storage medium.

19. The process according to claim 18, further comprising, at least in part prior to forming said interaction system, forming corresponding electronics within said substrate, via CMOS processes.

20. The process according to claim 19 wherein said electronics are made before electrochemically etching said substrate.

21. The process according to claim 18, comprising forming an array of said interaction systems in said surface portion of said substrate, arranged in rows and columns; said electrochemically etching separating simultaneously the supporting elements of said interaction systems from said substrate.

22. A method of making a microelectromechanical interaction system, comprising:
    forming a monocrystalline semiconductor first supporting element extending in cantilever fashion from a monocrystalline semiconductor substrate, the substrate and first supporting element being parts of the same monolithic crystal;
    forming a CMOS control circuit within said substrate; and
    forming a first interaction element carried by said first supporting element.

23. The method of claim 22 wherein the substrate has a first conductivity type and the supporting element and interaction element have a second conductivity type opposite to the first conductivity type.

24. The method of claim 23, further comprising forming a resistor of the first conductivity type within the supporting element.

* * * * *